United States Patent

[11] 3,591,834

[72] Inventor John T. Kolias
Vestal, N.Y.
[21] Appl. No. 887,451
[22] Filed Dec. 22, 1969
[45] Patented July 6, 1971
[73] Assignee International Business Machines Corporation
Armonk, N.Y.

[56] References Cited

UNITED STATES PATENTS

| | | | |
|---|---|---|---|
| 3,270,311 | 8/1966 | Deer et al. | 339/176 MP (UX) |
| 3,300,686 | 1/1967 | Johnson et al. | 317/101 DH (UX) |
| 2,482,201 | 12/1969 | Schneck | 339/176 MP (UX) |

FOREIGN PATENTS

| | | | |
|---|---|---|---|
| 1,133,620 | 11/1968 | Great Britain | 339/176 MP (UX) |

*Primary Examiner*—David Smith, Jr.
*Attorneys*—Hanifin and Jancin and Andrew Taras

[54] CIRCUIT BOARD CONNECTING MEANS
7 Claims, 6 Drawing Figs.

[52] U.S. Cl. .......... 317/101CC, 317/101 DH, 339/176 MP, 339/17 LM
[51] Int. Cl. .......... H05k 1/04
[50] Field of Search .......... 339/14 R, 176 MP, 17 L, 17 M, 17 LM, 17 LC, 22 R; 317/101 DH, 101 CC, 101 R

ABSTRACT: Printed circuit boards having perimeter edge connectors on either side of the boards are interconnected to each other by means of a removable connector comprised of top and bottom members to establish connections respectively to the top and bottom surfaces of said boards, the top member further having facilities to enable cable connections to be established to an external source which may be any form of an input/output instrumentality or another circuit board at some other location.

INVENTOR

JOHN T. KOLIAS

BY [signature]

AGENT

CIRCUIT BOARD CONNECTING MEANS

BACKGROUND OF THE INVENTION

The advent of miniaturization in the computer art and the necessity to provide greater volumetric efficiency has resulted in difficult circuit problems in the fabrication of printed circuit boards and the packaging techniques therefor. The most serious problem stems from crosstalk arising from inadequate design in establishing interconnections by way of cables and connectors between circuit boards and external input/output gear.

Objects

The present invention is accordingly directed to overcome the deficiencies of the prior art by providing a novel connector, for interconnecting printed circuit boards, which simplifies connection problems, increases reliability, reduces cost and improves overall electrical and mechanical performance.

In addition to the foregoing objects, the novel connector eliminates the need for cable interconnections between boards. It shortens the interconnection path between boards, thus decreasing electrical delay time. It provides a facility whereby input/output cables may be interconnected with ease. The connector further incorporates a strip line structure employing internal ground planes for shielding the signals transmitted so that crosstalk noise between signals is substantially reduced. The connector is further adaptable to wire-wrap techniques, as well as to all forms of cable termination techniques known to the prior art. The connector further alleviates board strain and thus eliminates the necessity for providing strain relief as was the practice in the prior art.

The foregoing and other objects, features and advantages of the invention will be apparent from the following more particular description of preferred embodiments of the invention, as illustrated in the accompanying drawings.

DESCRIPTION OF THE PREFERRED EMBODIMENT

In order to appreciate one of the unique features of the invention, namely to permit simultaneous board-to-board connections as well as establish cable connections therefrom to an external source such as input/output instrumentalities or the like, it might be well to point out initially that printed circuit boards are of the planar type which may be either by a single layer or a multilayer board adaptable to receive pluggable modules on one surface thereof, whereas the opposite surface is provided with printed circuit connections which can be conveniently interconnected to the corresponding surfaces of adjacent boards with ease and simplicity.

Figure 1:
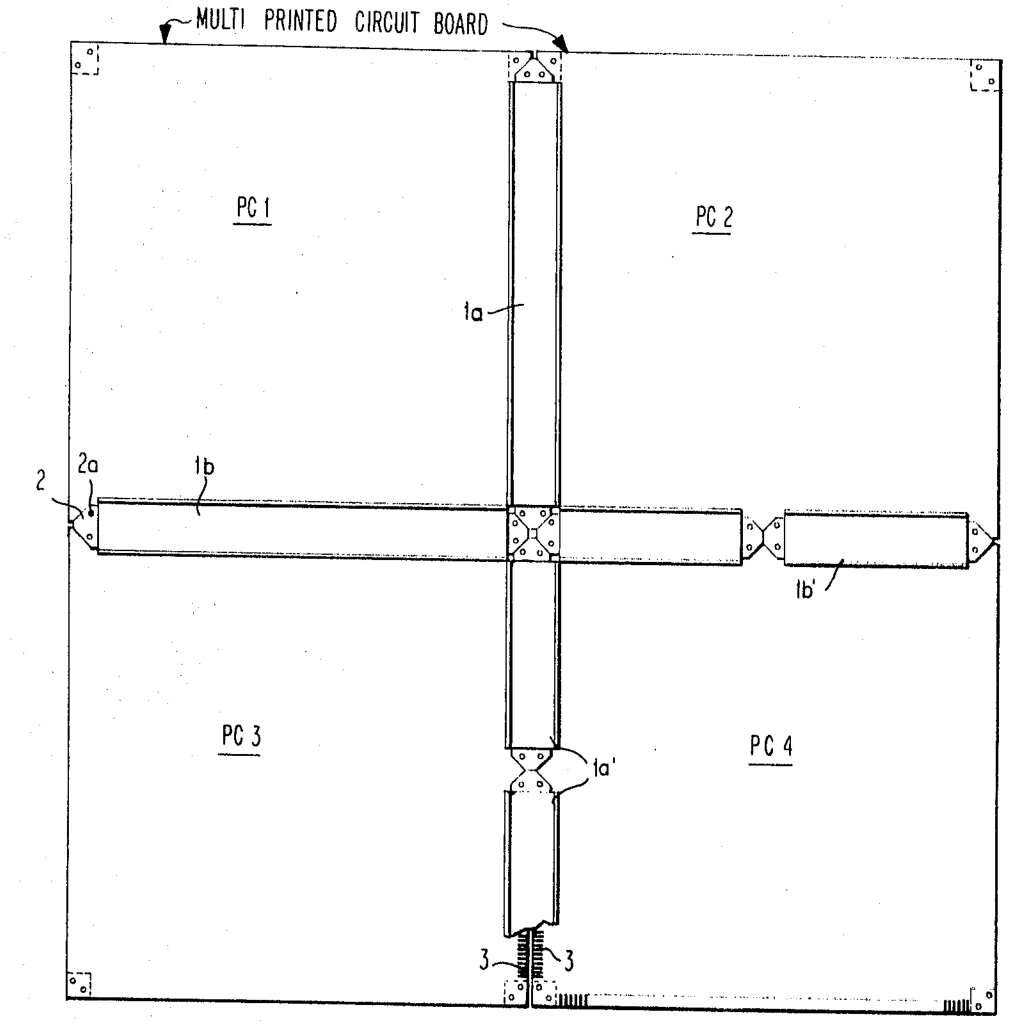
FIG. 1 is a plan view showing four printed circuit boards interconnected by means of the novel connector constituting the invention.

Referring to FIG. 1, there are shown four printed circuit boards PC1, PC2, PC3 and PC4, placed side-by-side in the form of a square and interconnected by the novel connector. Printed circuit boards PC1, PC2 and PC3 are interconnected by connector 1*a* and 1*b* which are in reality the top members of the connector assembly and are coextensive with the edges of said boards. The printed circuit board PC4 is interconnected to boards PC3 and PC2 by way of connectors 1*a'* and 1*b'*, the shorter connectors being used when greater rigidity is required. It may be appreciated that FIG. 1 is a plan view and as such the lower members of the connectors are not seen. However, all upper and lower members have terminal portions such as 2 in the case of the upper members provided with a pair of openings 2*a* through which screws are passed to fasten the upper and corresponding lower members together and between which are clamped the edges of the printed circuit boards. As seen in the lower central section of the drawing FIG. 1, the top surface edge of boards PC3 and PC4 are partially exposed to reveal printed circuit tabs 3. These tabs 3 which are on opposing edges of the boards PC3 and PC4 are interconnected by the member 1*a'*. The various modules to which reference was earlier made, are not shown. However, these modules are interconnected by way of printed circuit connections to the tabs 3. Similar edge tabs on the opposite surface of the printed circuit boards are utilized in a similar manner to establish interconnections between corresponding lower surfaces on adjacent boards. This will be more fully appreciated from the drawing of FIG. 2 to which reference is now invited.

Figure 2:
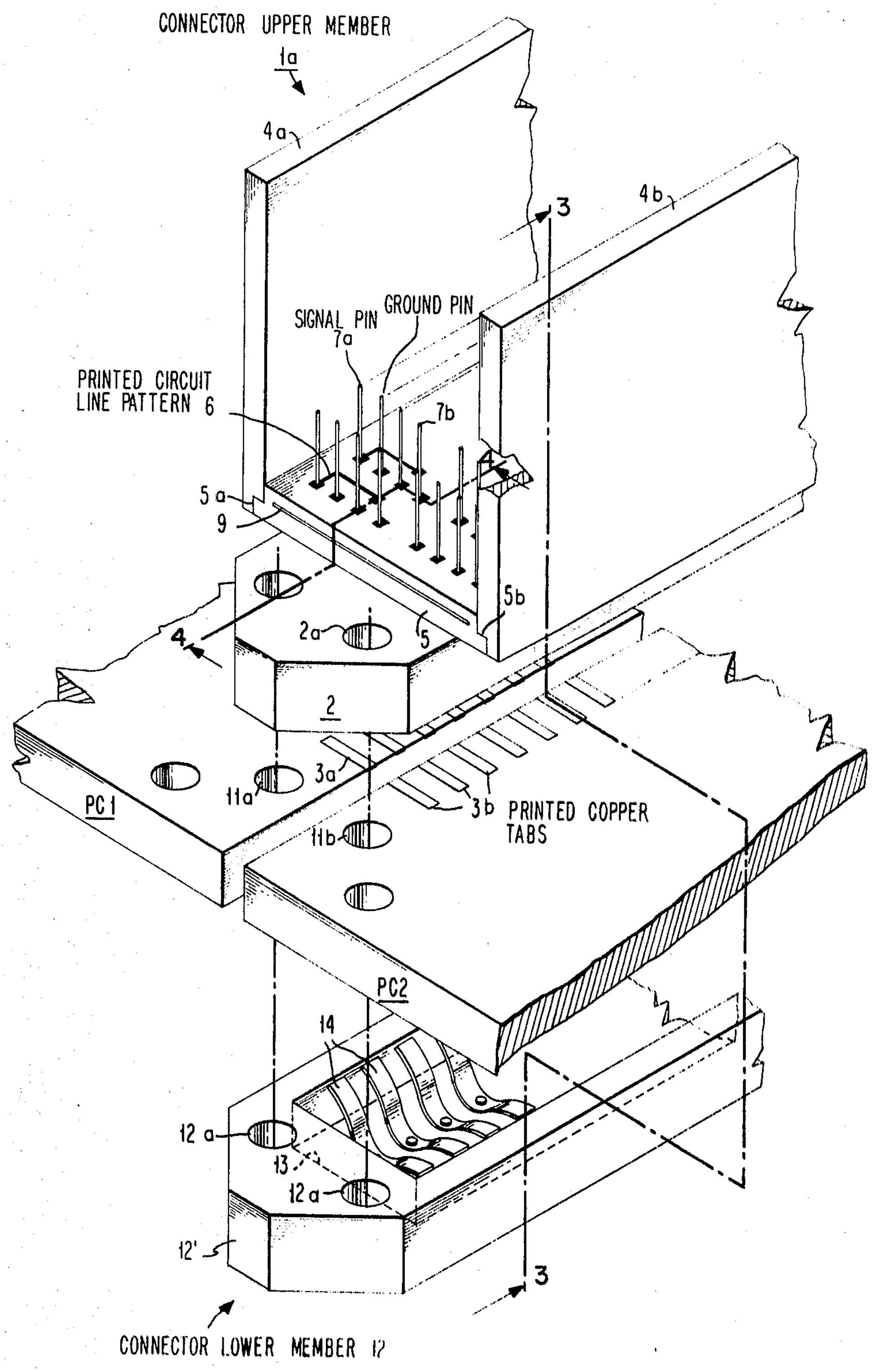
FIG. 2 is a partial isometric view showing details of the circuit boards and the novel connector.

In this partial view of FIG. 2 the connector upper member 1*a* is connected to the lower member 12 between which are clamped the circuit boards PC1, PC2 and interconnected electrically.

Figure 3:
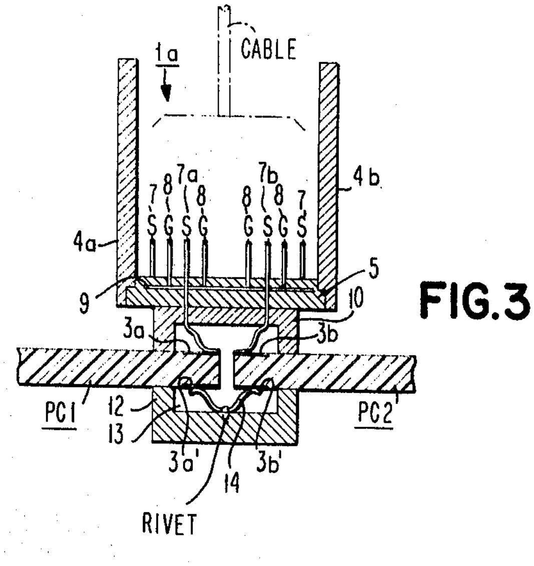
FIG. 3 is a cross-sectional view taken along the lines 3–3 in the view of FIG. 2.
Figure 4:
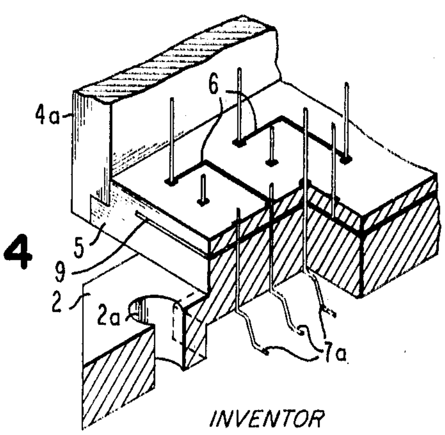
FIG. 4 is a partial cross-sectional view taken along lines 4–4 in the view of FIG. 2.

Structurally, the upper member 1*a* has a channel portion comprised of upright walls 1*a*, 1*b* bonded to a strip line structure 5 along edges 5*a*, 5*b*. The strip structure has a printed circuit pattern configuration 6 on the top surface thereof to which are connected signal pins 7, 7*a*, 7*b*, the latter passing through the structure, as seen in FIG. 3, to make contact with the edge tabs 3*a*, 3*b* on the top surface of the boards PC1, PC2. Intermediate said signal pins are ground pins 8 electrically connected to an embedded ground strip 9 which is coextensive with said structure 5. From an inspection of FIG. 4 it is seen that the signal pins 7*a* pass through the ground plane 9 but are electrically insulated therefrom, the arrangement providing the necessary shielding for the signal pins and thereby enabling high frequency operations with high reliability.

As seen in FIG. 3, the upper member 1*a* has secured thereto a channel member 10 along the bottom surface of said strip structure 5. Depending upon design consideration this member 10 may either be contiguous with the member 1*a* or it may be a separate structure bonded to 1*a* as shown. The lower member 12 comprises essentially a channel-shaped structure having a recess 13 in which are disposed spring blade members 14 adapted to interconnect tabs 3*a'*, 3*b'* disposed on the bottom surfaces of boards PC1, PC2 as shown in FIG. 3.

All printed circuit boards to be interconnected are provided with openings such as 11*a*, 11*b* that are in alignment with the terminal openings 2*a*, 12*a* in the upper and lower connector members respectively. When the boards and the connectors are properly aligned, they are suitably clamped together with suitable means, bolts or the like, not shown.

The upper connector member 1*a* is adapted to function as a cable harness to receive any suitable type of cable which is connectable to an input/output device or another board disposed in a plane removed from the plane of the instant boards.

Figure 5:
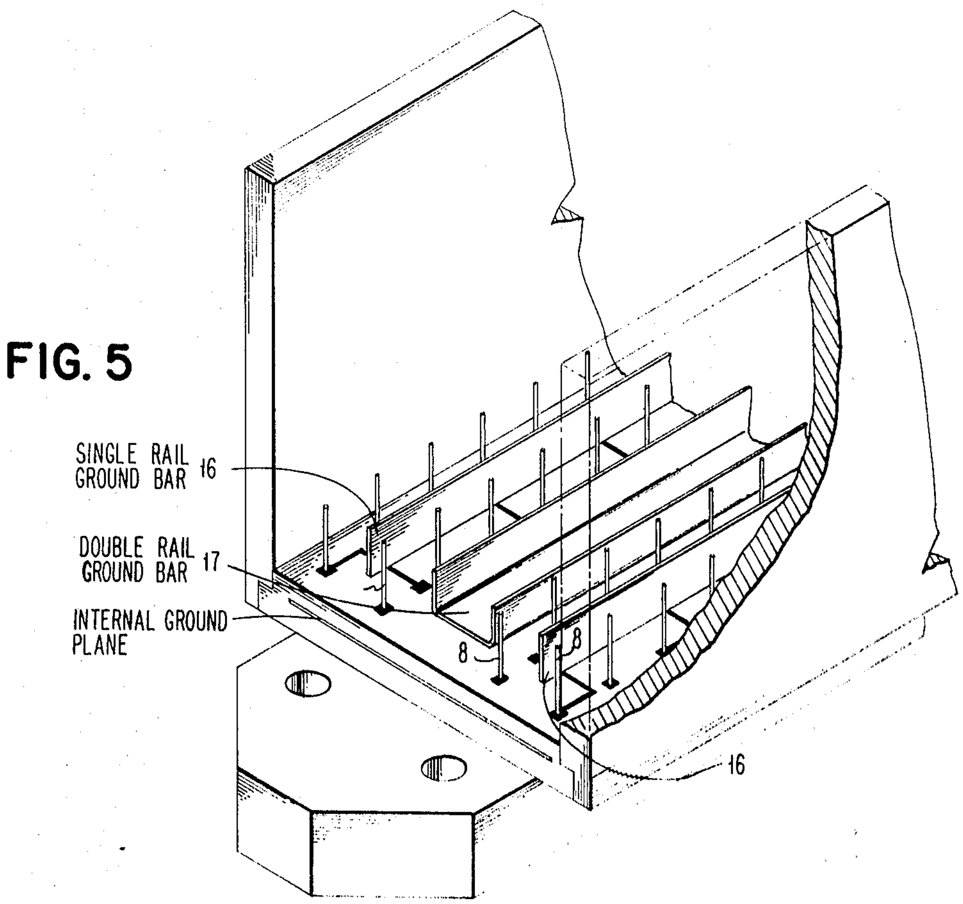
FIG. 5 shows a detail of the channel forming a portion of the upper connector member, for housing an external cable connection.
Figure 6:
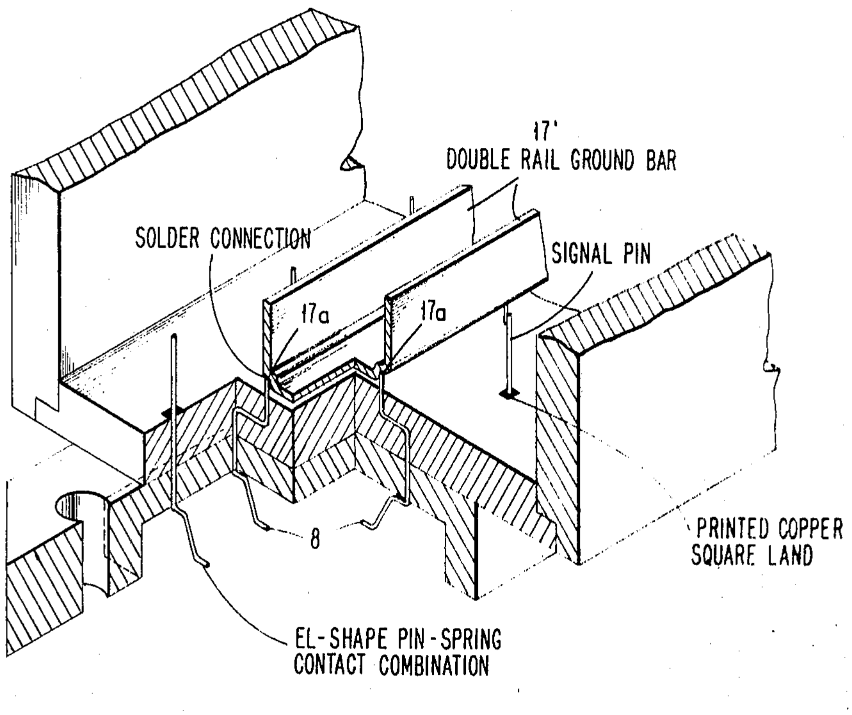
FIG. 6 shows a detailed cross-sectional view of a portion of the connector shown in FIG. 5.

The arrangements shown in FIGS. 5 and 6 are provided to accommodate cables or individual wires terminated with different types of connectors, for example, tuning fork connectors. In the embodiment of FIG. 5 the upper member generally referenced 15 is provided with single rail ground bars 16 and a double rail ground bar 17, the particular arrangement of the ground bars being exemplary only; any combination or variation of these rail bars can be utilized depending upon the configurations of the connecting cables. The rails are spaced above the printed circuit patterns by approximately 20 mils and secured in this position by any suitable bonding agent to the ground pins as shown.

The embodiment in FIG. 6 shows a detailed arrangement for supporting the double rail ground bar 17′, the latter having recessed channels 17*a* engaged by the pins 8 and bonded thereto by solder or other appropriate bonding arrangement.

In the foregoing description it has been indicated that the top surface of the printed circuit board is adapted to receive the various modules and the bottom or opposite surface depending only the printed circuit patterns necessary to establish the interboard connections. This arrangement is, of course, exemplary since other arrangements may suggest themselves depending upon the environment to which the circuit boards are subjected. For instance, if a liquid cooling type of an environment is desired, it may be necessary to design the connector such that the modules are placed on the bottom surfaces of the boards whereas the top surfaces would contain the interboard connecting patterns and the channel for harnessing the cable would be adapted to receive the cable from the top surface of the boards. Thus, depending upon the environment to which the circuit boards are subjected, different arrangements for the connectors and for the cable harness will suggest themselves.

A more simplified version of the invention may be utilized in applications wherein the circuit board contains printed patterns on but one surface, in which instance the spring members 14 may be disposed of and the lower member 12 may be utilized merely to effect mechanical interconnections between the boards.

While the invention has been particularly shown and described with reference to preferred embodiments thereof, it will be understood by those skilled in the art that the foregoing and other changes in form and details may be made therein.

What I claim is:

1. A circuit board connector for mechanically interconnecting circuit boards along their planar peripheral surface edges and simultaneously establishing interboard electrical connections and external connections by way of electrical conductive pads disposed on either side and along said peripheral edges of said boards comprising:

a first longitudinal member disposed to mechanically engage the planar peripheral surface edges on one side of said boards, said member having a plurality of spring blade members each adapted to engage a pair of opposed tabs on one side of adjacently disposed boards to establish electrical connections therebetween;

a second longitudinal member disposed to mechanically engage correspondingly peripheral planar surface edges on the opposite side of said boards, said second member having an internal ground plane, and a plurality of electrically conductive signal pins electrically isolated from one another and passing through said plane but electrically isolated therefrom, each pin adapted to engage an individual tab on said opposite side of said boards, and mechanical means for securing said members to said boards to mechanically interconnect said boards and to provide the electrical connections therebetween and between said boards and said external connections.

2. The connector as in claim 1 in which ground pins are interposed between said signal pins and interconnected to said ground plane.

3. The connector as in claim 1 in which the surface of said second member is further provided with a printed circuit pattern interconnecting said signal pins.

4. The connector as in claim 1 in which said second member is further provided with a ground rail connected to desired ones of said ground pins and held in spaced relationship above said printed circuit pattern.

5. The connector as in claim 1 in which said ground rail is constituted of a single rail.

6. The connector as in claim 1 in which said ground rail is constituted of a double rail.

7. The connector as in claim 1 in which said second member has a generally shaped configuration adapted to receive an external cable connection.